(12) United States Patent
Madsen et al.

(10) Patent No.: US 10,776,240 B2
(45) Date of Patent: Sep. 15, 2020

(54) NON-INTRUSIVE PERFORMANCE MONITOR AND SERVICE ENGINE

(71) Applicant: Seagate Technology LLC, Cupertino, CA (US)

(72) Inventors: Christian Bruun Madsen, Longmont, CO (US); Estelle Anne-Marie Cormier, Boulder, CO (US)

(73) Assignee: Seagate Technology LLC, Fremont, CA (US)

( * ) Notice: Subject to any disclaimer, the term of this patent is extended or adjusted under 35 U.S.C. 154(b) by 741 days.

(21) Appl. No.: 15/584,573

(22) Filed: May 2, 2017

(65) Prior Publication Data

US 2018/0137024 A1  May 17, 2018

Related U.S. Application Data

(60) Provisional application No. 62/421,026, filed on Nov. 11, 2016.

(51) Int. Cl.

| | |
|---|---|
| *G06F 11/30* | (2006.01) |
| *G06F 11/34* | (2006.01) |
| *G11C 29/08* | (2006.01) |
| *G11C 29/56* | (2006.01) |
| *G11C 29/44* | (2006.01) |

(Continued)

(52) U.S. Cl.
CPC ...... *G06F 11/3409* (2013.01); *G06F 11/3447* (2013.01); *G06F 11/3452* (2013.01); *G06F 11/0727* (2013.01); *G06F 11/3034* (2013.01); *G06F 11/3096* (2013.01); *G06F 11/321* (2013.01); *G06F 11/3485* (2013.01); *G06F 11/3495* (2013.01); *G11C 29/08* (2013.01);

(Continued)

(58) Field of Classification Search
USPC ........................................................ 702/183
See application file for complete search history.

(56) References Cited

U.S. PATENT DOCUMENTS

| | | | |
|---|---|---|---|
| 7,890,837 B2 | 2/2011 | Boskovic | |
| 7,971,093 B1 * | 6/2011 | Goel ..................... | G06F 11/004 |
| | | | 714/6.22 |

(Continued)

FOREIGN PATENT DOCUMENTS

| | | |
|---|---|---|
| CN | 104317693 A | 1/2015 |
| WO | 2014111920 A1 | 7/2014 |

*Primary Examiner* — Paul D Lee
(74) *Attorney, Agent, or Firm* — Kagan Binder, PLLC

(57) ABSTRACT

A method of monitoring a plurality of storage devices using a storage management system includes receiving and analyzing input/output data related to the storage devices and generating a model in response to the monitoring, including the detected input/output data related to at least a first and a second storage device, and where the input/output data includes at least one measurable storage device aspect. The method also includes determining, in response to the generating, that the first storage device is a control storage device, and that the second storage device is to be compared to the first storage device and comparing the input/output data of the second storage device to the first storage device according to the at least one measurable storage device aspect. The method also includes determining that the second storage device is operating sub-optimally and transmitting a notification that the second storage device is operating sub-optimally.

20 Claims, 13 Drawing Sheets

(51) Int. Cl.
*G11C 29/04* (2006.01)
*G06F 11/32* (2006.01)
*G06F 11/07* (2006.01)

(52) U.S. Cl.
CPC .......... *G11C 29/4401* (2013.01); *G11C 29/56* (2013.01); *G11C 2029/0409* (2013.01)

(56) References Cited

U.S. PATENT DOCUMENTS

| | | | |
|---|---|---|---|
| 8,868,797 B1* | 10/2014 | Kirac | G06F 3/061 |
| | | | 710/15 |
| 9,117,489 B1* | 8/2015 | Dang | G11B 27/36 |
| 9,189,309 B1 | 11/2015 | Ma et al. | |
| 9,229,796 B1 | 1/2016 | Ma et al. | |
| 9,317,224 B1* | 4/2016 | Aharoni | G06F 3/0689 |
| 9,379,951 B2 | 6/2016 | Mihnev | |
| 9,418,088 B1 | 8/2016 | Noll | |
| 2005/0198553 A1* | 9/2005 | Okamoto | G11B 20/1816 |
| | | | 714/5.11 |
| 2008/0056675 A1* | 3/2008 | Wright | H04H 60/37 |
| | | | 386/248 |
| 2009/0106480 A1* | 4/2009 | Chung | G06F 12/0866 |
| | | | 711/100 |
| 2009/0249013 A1* | 10/2009 | Daud | G06F 11/0709 |
| | | | 711/163 |
| 2014/0317443 A1 | 10/2014 | Bartlett et al. | |
| 2015/0074462 A1* | 3/2015 | Jacoby | G06F 11/079 |
| | | | 714/37 |
| 2015/0127804 A1 | 5/2015 | Kripalani et al. | |
| 2015/0149822 A1 | 5/2015 | Coronado et al. | |
| 2016/0034329 A1 | 2/2016 | Larson et al. | |
| 2016/0132394 A1 | 5/2016 | Niewczas | G06F 11/1092 |
| | | | 714/6.22 |
| 2016/0154688 A1 | 6/2016 | Barajas | |
| 2016/0217022 A1 | 7/2016 | Velipasaoglu et al. | |
| 2018/0123923 A1* | 5/2018 | Zhou | G06F 13/20 |

* cited by examiner

```
$ CAT /PROC/DISKSTATS
   1    0 RAM0  0 0 0 0 0 0 0 0 0 0 0
   1    1 RAM1  0 0 0 0 0 0 0 0 0 0 0
   1    2 RAM2  0 0 0 0 0 0 0 0 0 0 0
   7    0 LOOP0 0 0 0 0 0 0 0 0 0 0 0
   7    1 LOOP1 0 0 0 0 0 0 0 0 0 0 0
   8   32 SDC 22480 83 659140 143776 6656 6 6910 68648 0 95521 212413
   8   16 SDB 1396 80 2100340 484943 28308 1 28495 316239 0 324938 801168
   8   48 SDD 1696 118 2103068 559181 28303 0 28303 342051 0 351381 901214
   8   64 SDE 22472 82 658852 131222 6659 0 6814 82292 0 110358 213500
```

FIG. 9

| VARIABLE | CORRESPONDING ITEM KEY |
|---|---|
| SERIAL_NUMBER | ENCLOSURE_COMPONENTS.ATTRIBUTES [{$SERIAL_NUMBER}, DISK, 0, SERIAL_NUMBER] |
| PRODUCT_NAME (A.K.A. PRODUCT ID) | ENCLOSURE_COMPONENTS.ATTRIBUTES [{$SERIAL_NUMBER}, DISK, 0, PRODUCT_NAME] |
| READ_TIME_ms | DCS.IOSTATS.ATTRIBUTES [{$SERIAL_NUMBER}, DISK, 0, READ_TIME_ms] |
| READS_MERGED | DCS.IOSTATS.ATTRIBUTES [{$SERIAL_NUMBER}, DISK, 0, READS_MERGED] |
| SECTORS_READ | DCS.IOSTATS.ATTRIBUTES [{$SERIAL_NUMBER}, DISK, 0, SECTORS_READ] |
| TOTAL_READS | DCS.IOSTATS.ATTRIBUTES [{$SERIAL_NUMBER}, DISK, 0, TOTAL_READS] |
| WRITE_TIME_ms | DCS.IOSTATS.ATTRIBUTES [{$SERIAL_NUMBER}, DISK, 0, WRITE_TIME_ms] |
| WRITES_MERGED | DCS.IOSTATS.ATTRIBUTES [{$SERIAL_NUMBER}, DISK, 0, WRITES_MERGED] |
| SECTORS_WRITTEN | DCS.IOSTATS.ATTRIBUTES [{$SERIAL_NUMBER}, DISK, 0, SECTORS_WRITTEN] |
| TOTAL_WRITE | DCS.IOSTATS.ATTRIBUTES [{$SERIAL_NUMBER}, DISK, 0, TOTAL_WRITE] |

FIG. 10

| COLUMN | EXPLANATION | TYPE |
|---|---|---|
| SERIAL_NUMBER | DRIVE SERIAL NUMBER | STRING |
| ENCLOSURE_SERIAL_NUMBER | ENCLOSURE SERIAL NUMBER | STRING |
| TYPE | DEVICE TYPE (DISK) | STRING |
| INDEX | DRIVE SLOT NUMBER | UNIT |
| ID | <ENCLOSURE_SN>:<TYPE>:<INDEX> | STRING |
| ANOMALY_DETECTED | IS THE DRIVE SLOW? TRUE / FALSE | BOOLEAN |
| TIMESTAMP | DATE AT WHICH THE DRIVE WAS DETECTED SLOW | UNIT/TIMESTAMP (EPOCH) |
| EWMA | LAST VALUE OF THE EWMA | FLOAT |
| RESIDUAL [0-6] | LAST VALUES OF THE RESIDUALS | FLOAT |

FIG. 11

```
{
"SERIAL_NUMBER" : "YFH7T8BD",
"ENCLOSURE SERIAL_NUMBER" : "SHX0969022Y01P3",
"PRODUCT_NAME" : "ST60000",
"TYPE": "DISK",
"INDEX": 0,
"ID": "SHX0969022Y01P3:DISK:0",
"TIMESTAMP" : 123456,
"EWMA" : 2.126976709126970 0,
"ANOMALY_DETECTED" : 1,
"RESIDUAL10" : <FLOAT>,
"RESIDUAL11" : <FLOAT>,
"RESIDUAL12" : <FLOAT>,
"RESIDUAL13" : <FLOAT>,
"RESIDUAL14" : <FLOAT>,
"RESIDUAL15" : <FLOAT>,
"READ_TIME_ms" : <FLOAT>,
"READS_MERGED" : <FLOAT>,
"SECTORS_READ" : <FLOAT>,
"WRITE_TIME_ms" : <FLOAT>,
"WRITES_MERGED" : <FLOAT>,
"SECTORS_WRITTEN" : <FLOAT>,
}
```

FIG. 12

NON-INTRUSIVE PERFORMANCE MONITOR AND SERVICE ENGINE

CROSS-REFERENCE TO RELATED APPLICATIONS

This application claims the benefit of U.S. Provisional Patent Application No. 62/421,026, filed Nov. 11, 2016, the entire contents of which are incorporated herein by reference in their entirety.

BACKGROUND

The present disclosure relates to improvements to the monitoring of storage devices, and relates more particularly to monitoring the performance of storage devices to identify slow or underperforming storage devices.

Solid-state drives (SSDs) and hard-disk drives (HDDs) are two common types of storage devices. A drive is a type of electronic storage device, and the terms drive and storage device may be used interchangeably for the purposes of this disclosure. Drives are commonly employed in a wide variety of computing applications requiring various types and amounts of electronic data storage. Over time, drives have generally become smaller, faster, and more storage-dense over time.

However, even precision-made, stable, and properly maintained drives can still be subject to performance degradation and/or failure from time to time. Each drive can be tested and profiled, a procedure sometimes referred to as benchmarking, at various times to diagnose reduced performance and/or functionality. Benchmarking tends to be time and resource consuming, often requiring that the drive being tested be temporarily removed from production use. These drawbacks can apply even if it is ultimately determined that the drive is performing optimally. Therefore, there is a desire to more efficiently monitor and maintain drive performance.

SUMMARY

In one aspect of the present disclosure, a method includes monitoring a plurality of storage devices using a storage management system. The method also includes the monitoring includes receiving and analyzing input/output data related to the storage devices. The method also includes generating a model in response to the monitoring, where the model includes the detected input/output data related to at least a first and a second storage device, and where the input/output data includes at least one measurable storage device aspect. The method also includes determining, in response to the generating, that the first storage device is a control storage device, and that the second storage device is to be compared to the first storage device. The method also includes comparing the input/output data of the second storage device to the first storage device according to the at least one measurable storage device aspect. The method also includes determining that the second storage device is operating sub-optimally. And, the method also includes transmitting a notification that the second storage device is operating sub-optimally.

A second aspect of the present disclosure is directed to a system for monitoring storage device performance. The system includes a processor and a memory operatively coupled to the processor. The system includes a storage medium operatively coupled to the processor and the memory, where the storage medium includes a data collection system configured to monitor a plurality of storage devices using a storage management system where the monitoring includes receiving and analyzing input/output data related to the storage devices. The system also includes a model generator configured to generate a model in response to the monitoring, where the model includes the detected input/output data related to at least a first and a second storage device, and where the input/output data includes at least one measurable storage device aspect. The system also includes the processor being configured to determine, in response to the generating, that the first storage device is a control storage device, and that the second storage device is to be compared to the first storage device. The processor is also configured to compare the input/output data of the second storage device to the first storage device according to the at least one measurable storage device aspect. The processor is also configured to determine that the second storage device is operating sub-optimally. And, the processor of the system is also configured to transmit a notification that the second storage device is operating sub-optimally.

A third aspect of the present disclosure is directed to a computer program product for monitoring storage device performance comprising: a computer-readable storage device having a computer-readable program stored therein, where the computer-readable program, when executed on a computing device, causes the computing device to monitor a plurality of storage devices using a storage management system, where the monitoring includes receiving and analyzing input/output data related to the storage devices. The computer readable program also causes the computing device to generate a model in response to the monitoring, where the model includes the detected input/output data related to at least a first and a second storage device, and where the input/output data includes at least one measurable storage device aspect. The computer readable program also causes the computing device to determine, in response to the generating, that the first storage device is a control storage device, and that the second storage device is to be compared to the first storage device. The computer readable program also causes the computing device to compare the input/output data of the second storage device to the first storage device according to the at least one measurable storage device aspect. The computer readable program also causes the computing device to determine that the second storage device is operating sub-optimally. The computer readable program also causes the computing device to transmit a notification that the second storage device is operating sub-optimally.

These and various other features and advantages will be apparent from a reading of the following detailed description.

BRIEF DESCRIPTION OF THE DRAWINGS

Other important objects and advantages of the present invention will be apparent from the following detailed description of the invention taken in connection with the accompanying drawings.

FIG. 9 is a representation of storage device information shown once extracted from an example storage device during a monitoring stage, according to various embodiments.

FIG. 10 is a table with example fields based on a process run on a drive, according to various embodiments.

FIG. 11 is a representative table layout of saved data following the running of a described process on a drive, according to various embodiments.

FIG. 12 is a JSON code data array with one entry per storage device that has been flagged as slow, according to various embodiments.

DETAILED DESCRIPTION

As outlined above, benchmarking is a commonly-employed method of evaluating components based on performance metrics, but has drawbacks. Computer program or hardware benchmarking typically runs a number of tests and/or trials on a selected program on one or more hardware components of a computer, or in some case on the entire computer. However, benchmarking also includes performance-reducing drawbacks, particularly with respect to the fact that benchmarking is itself a program or subroutine that is run on the program or component to be evaluated, causing an opportunity cost of other potential operations.

As an alternative to and replacement for traditional benchmarking, examples of non-intrusive, benchmark-less performance monitoring schemes are disclosed. As an overview, new systems and methods include using timely and appropriate system level responses to alleviate data access and performance issues. Examples of drives, as contemplated herein, include hard-disk drives (HDDs), solid-state drives (SSDs), hybrid drives (e.g., various combinations of HDD and SSD), and many other storage and memory packages. Drive performance issues and degradation can be detected using veracious performance-monitoring schemes.

Once a drive has been identified as being subject to performance degradation, and has been correspondingly tagged as such, a process including timely and appropriate corrective actions can be performed. Described corrective actions can avoid or reduce impact of the overall storage system of which the storage device is a part, including cloud storage systems, data center deployments, etc., leading to substantial improvements in drive and overall system performance.

Figure 1:
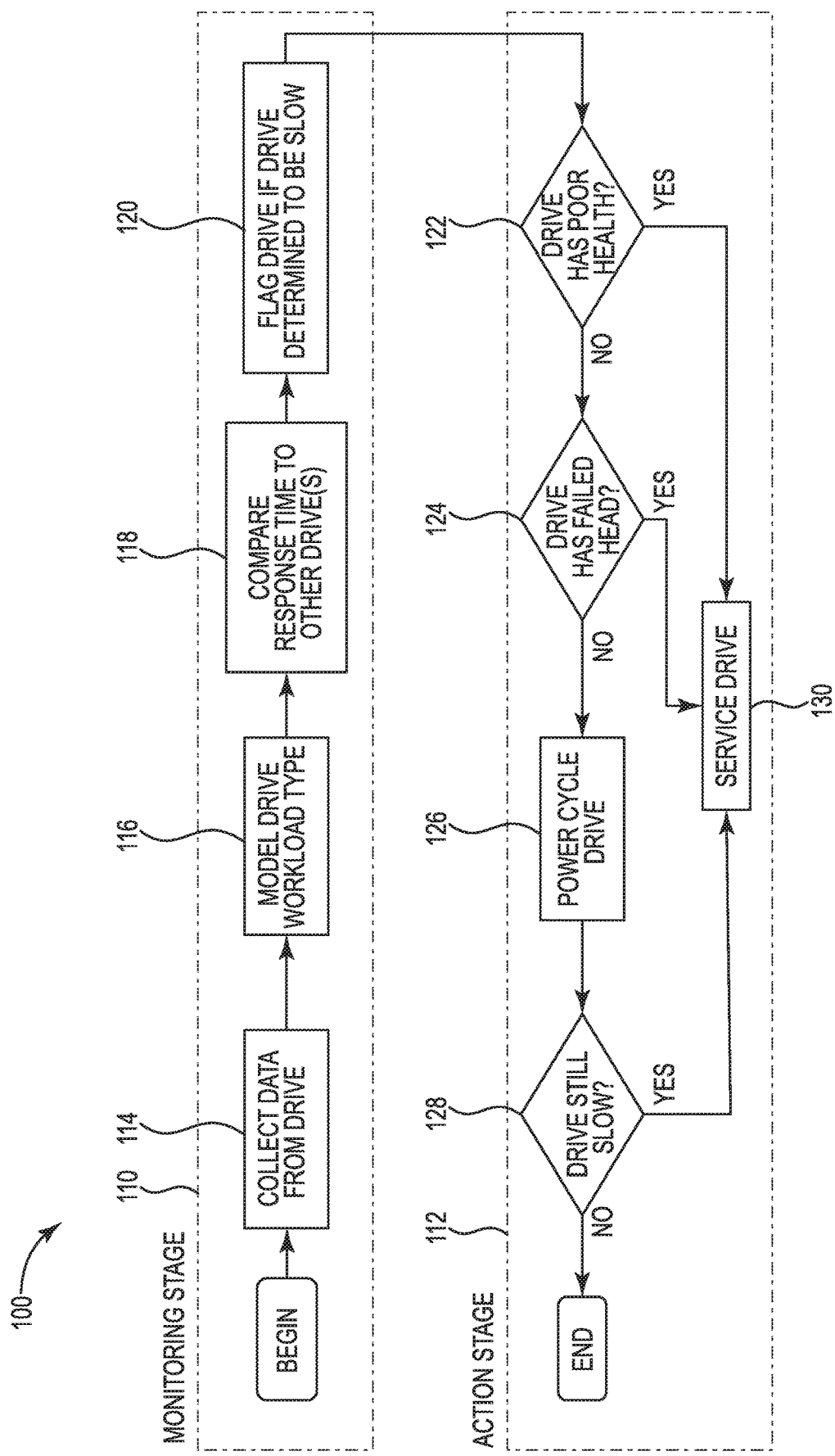
FIG. 1 is a flowchart of a process of non-intrusive drive performance monitoring, according to various embodiments.

FIG. 1 is flowchart of a process 100 of non-intrusive drive performance monitoring, according to various embodiments.

Non-intrusive monitoring of one or more drive, including dynamic workload characterization of each drive, can include the ability to detect and sometimes repair slow devices, as disclosed. Such non-intrusive performance monitoring can advantageously be run passively in the background during normal work cycle, and preferably will not add a performance impact. In this way, and as further described herein, the former need for traditional benchmarks can be made superfluous.

In order to perform the non-intrusive drive performance monitoring process 100, various operations may preferably be performed. The process may include two stages, including a monitoring stage 110 and an action stage 112. Each stage may include various operations, and the monitoring stage 110 may preferably occur prior to the action stage 112. Various action stage 112 operations may be based at least in part on various monitoring stage 110 operations. However, upon the completion of the action stage 112, selected parts of or entire process 100 may repeat. In some embodiments, another monitoring stage 110 may be performed, according to various embodiments.

To begin the monitoring stage 110, drive data may preferably be collected 114. The drive data collection at operation 114 may, for example, occur host-side within a computing network. According to some preferable embodiments, drive data relating to a drive being tested or assessed can be collected host-side using an operating system (e.g., Linux) tool where relevant drive performance metrics (e.g., drive input/output statistics) are collected in order to discern a number of available performance-related metrics relating to the drive. The drive data collection at operation 114 is preferably based on one or more workload-type inferences within a multi-way device-to-device comparison.

Once drive data is collected at operation 114, the drive data may be modeled by drive workload type at operation 116. Based on the collected drive data, methods can be used to generate one or more models for that drive at operation 116, which determines, analyzes, and/or displays the workload type (e.g., random, sequential, or mixed). In some examples, corresponding drive response times can be plotted in an effective random/sequential/mixed workload (RSMW) space.

Once the drive workload type has been determined (and/or modeled at operation 116), the response time and/or other data of the drive can be compared to the data of one or more other selected or comparable drive(s) at operation 118. For example, in the RSMW space, a response time (or other data) of the particular drive being tested can be compared to the response time of other, comparable drive(s), which may represent one or more designated "control" drives, intended to represent an example drive performance baseline. The drive-drive comparison can include using data collection to create a functional fit of the response time of a drive, using a time average such as a sliding and/or weighted average.

Following the drive comparison at operation 118, it may preferably be determined that a particular drive is determined to be slow, underperforming, or is otherwise performing sub-optimally. If a drive is found to be slow at operation 120, that slow drive can be flagged, marked, or otherwise tagged. If a device being assessed is found to be slow, the device can be flagged, tagged, or otherwise marked as such, then a series of actions can be initiated. For example, if the performance of the drive in question is moderately poor according to various drive failure criteria (e.g., a basic self-monitoring, analysis, and reporting technology [SMART] failure, or other criterion for which a drive may be under factory warranty), the drive or drive controller can send a corresponding drive management system a notification that service is needed.

Following and in response to flagging a slow drive in the monitoring stage, action stage 112 can optionally begin. In the action stage 112, various corrective actions can be performed, such as replacing or repairing the drive having the detected, comparatively-deduced performance issue(s). Various details of the monitoring 110 and action 112 stages are described further, herein.

In some embodiments, following (or during) a flagging procedure of an example drive at 120, it may be determined that the drive has poor health at 122. If the drive is found to have poor health, the drive can be serviced at 130, accordingly. Servicing a drive may include physical removal and repair or replacement, switching to and population of a different drive, repairing the drive in place, or remanufacturing, firmware update, and/or drive reset.

If the drive is determined to have poor health, and is found to have a specific failure, such as a failed head, at 124, then the drive and/or head can be serviced at 130, according to various embodiments. An example of servicing a drive with a failed head can include depopulating the head using field "remanufacturing" methods (e.g., so-called "REMAN," where a drive head is depopulated and taken out of use).

If the drive continues to be disadvantaged by poor performance, the drive may be power-cycled via the drive's enclosure at 126. An example power cycle can take roughly 120 seconds to complete, of which a spin-up and spin-down can take less than a minute (e.g., 30 seconds) for an example 3-terabyte drive. For an example drive with enumerated by SCSI/OS layers, a power cycle duration may be about 60 seconds, but may vary based on circumstances and configuration, according to various embodiments. In addition to a power cycle of the drive, in some embodiments, the drive can also be reset to factory defaults before or after the power cycle process.

Following the drive being power cycled at 126, if the drive has not been tagged for service at 130, but the drive continues to be characterized as slow, a drive management system can check the projected failure rate of the system based on the available drive data collected at 114. If the drive management system determines that the projected failure rate of the system is below (i.e., worse than) average, then the management system can be notified that service of the drive is needed at 130, followed by an optional transmission of such service notification to a user or other system that one or more devices are detected to be anomalous. Process 100 may then end or various parts of process 100 may optionally repeat, as appropriate.

Implementation of specific operations described herein may vary as, for instance, more drive assessment and management features are added to deal with partially damaged drives during the action stage 112. In terms of prioritization, an initial focus of the monitoring stage 110 may be on a particularly slow drive, followed by prompt, appropriate action at action stage 112. In the case of high performance computing (HPC) systems, a single slow disk can at times negatively affect an overall system's performance. In addition, incorrectly flagging a drive as slow may negatively and counterproductively affect a system's performance instead of improving it.

Figure 2:
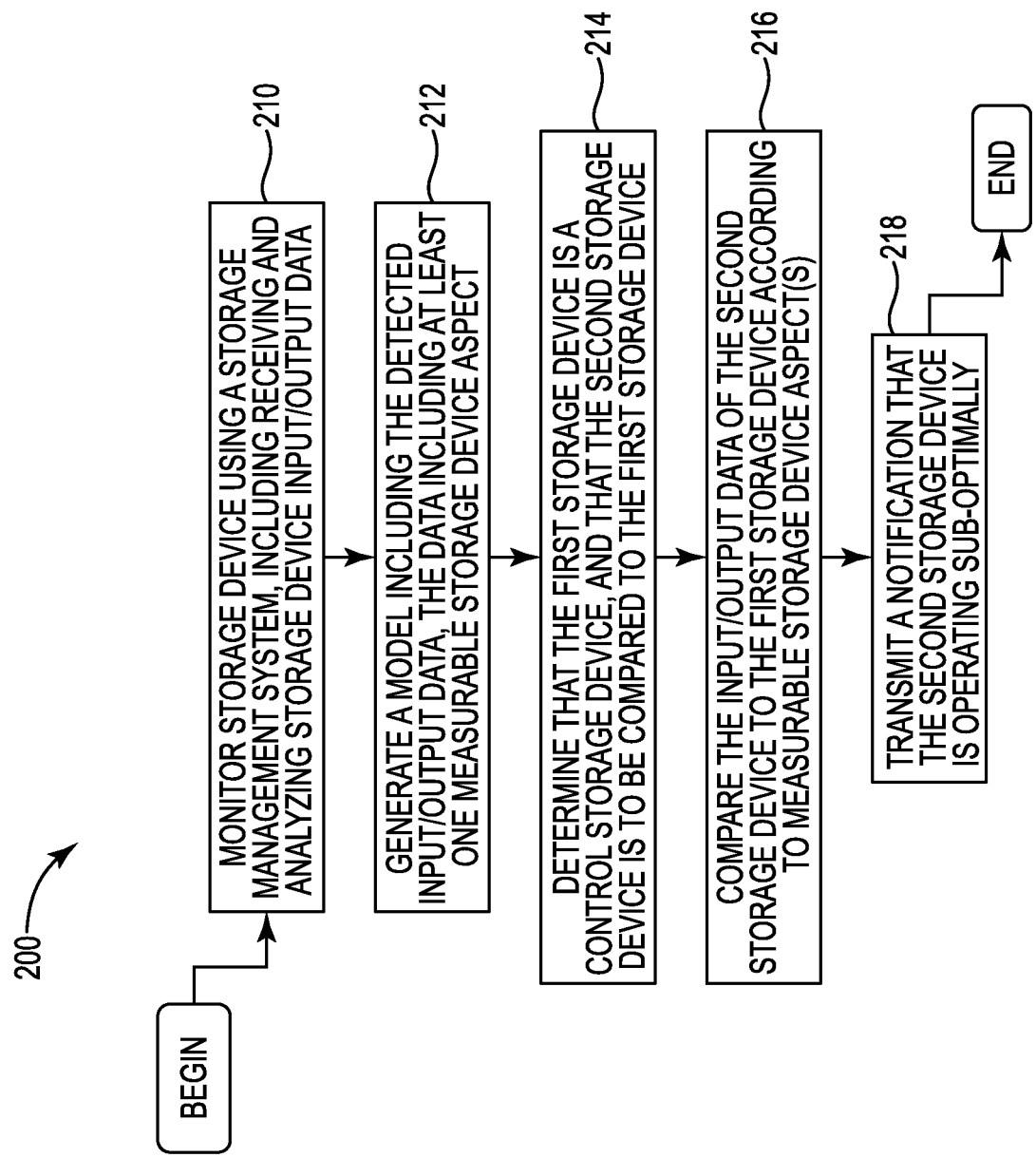
FIG. 2 is a flowchart representing a process of drive performance monitoring, according to various embodiments.

FIG. 2 is a flowchart representing a process 200 of drive performance monitoring, according to various embodiments. Process 200 can include monitoring stage 110 operations and/or action stage 112 operations of process 100, as described with respect to FIG. 1.

An embodiment of the present invention can include process 200, which may begin by monitoring a first storage device (e.g., a drive) using a storage management system at operation 210. A second (or third, fourth, etc.) storage device can also be monitored. The monitoring at operation 210 can include receiving and analyzing storage device input/output data, among other storage device data relating to the first and second storage devices.

Following the monitoring at operation 210, a model can be generated at operation 212, which can include and be based on the detected input/output data. The detected input/output data can preferably include at least one measurable storage device aspect. After the model is generated at operation 212, it can then be determined or ascertained that the first storage device is a control storage device, and that the second storage device is to be compared to the first storage device at operation 214.

The input/output data of the first and second storage device can then be compared at operation 216. The comparison can preferably be according to one or more measurable storage device aspect(s). Following the comparison at operation 216, a notification can be transmitted that the second storage device is operating sub-optimally at operation 218, and the process may end, or a drive service or action stage 112 (see FIG. 1) may be performed, according to some embodiments.

Figure 3:
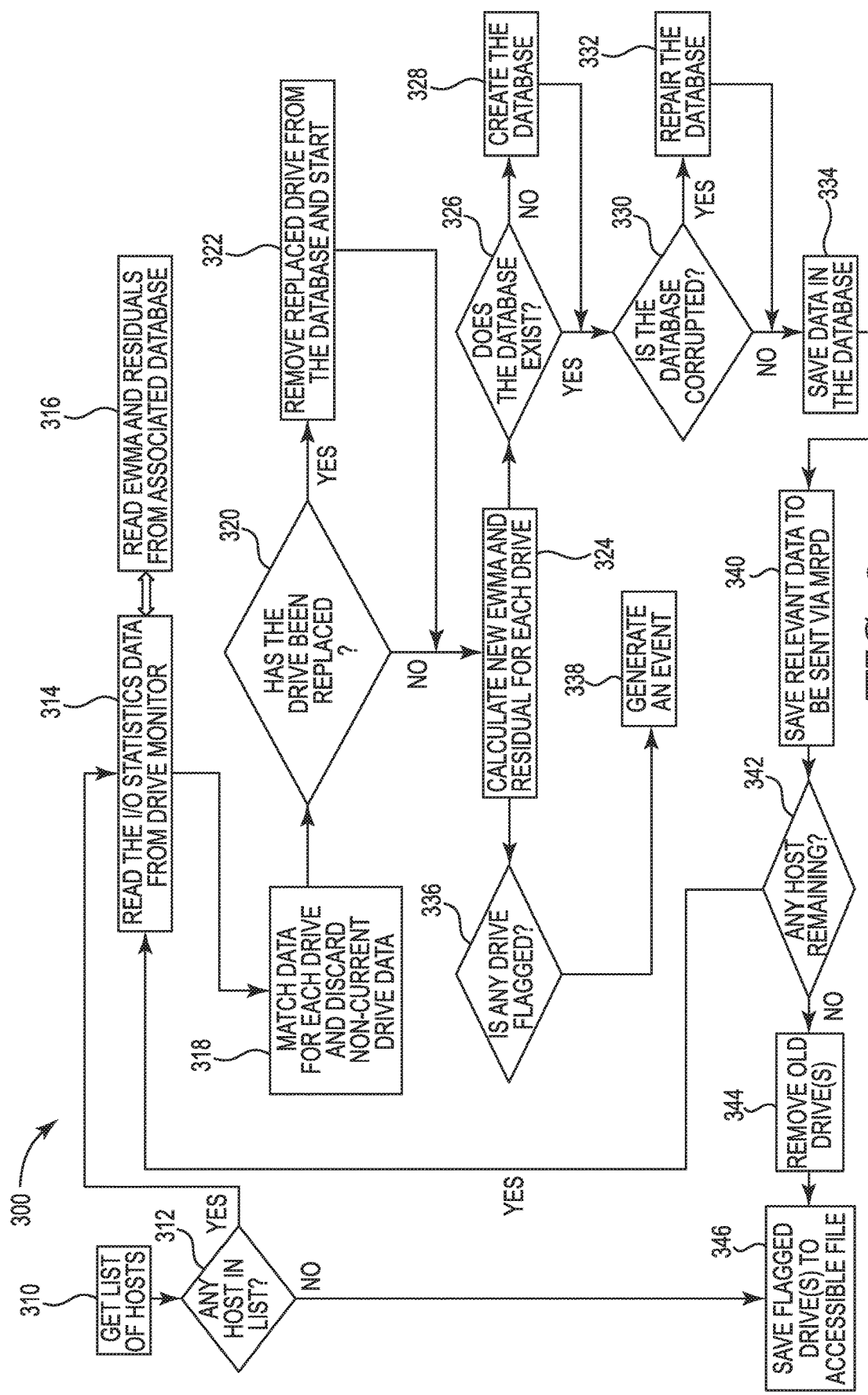
FIG. 3 is a flowchart depicting another process of drive performance monitoring, according to various embodiments.

FIG. 3 is a flowchart depicting another process 300 of drive performance monitoring, according to various embodiments. Process 300 can include monitoring stage 110 operations and/or action stage 112 operations of process 100, as described with respect to FIG. 1.

Process 300 represents another embodiment of a drive performance monitoring scheme, and process 300 can begin by receiving or otherwise getting a list of hosts at operation 310. If it is determined that there is no host in the list at operation 312, then the process 300 may end. If, however, it is determined that there exists at least one host in the list at operation 312, then input/output (I/O) statistics can be read from a drive monitor. The reading can include reading (e.g., exponentially weighted moving average [EWMA]) values and residuals from an associated and relevant database at operation 316. Following the reading of drive data at operation 314, the data for each drive can be matched to the appropriate drive by serial number at operation 318. At operation 318, preferably only drives with current data are considered. Drive data stored in a database that does not match any current drives are preferably discarded, while the remaining drives and data can be considered current.

According to process 300, it may then be determined whether a particular drive has been replaced, and whether there exists a drive that does not match any drive in the database, and vice-versa at operation 320. One example indication that a drive has been replaced would be a server slot number associated with two different drive serial numbers. If there is a drive that has been replaced or does not match any drive in the database or vice-versa, then a replaced drive can be removed from the database and a new EWMA can be calculated or otherwise received for each at operation 322. Operation 322 can occur locally or by a remote log command. If, however, at operation 320 there are no drives that do not match a drive in the database or vice-versa, then a new EWMA and residual may be calculated or received for each drive at operation 324. Embodiments of the disclosed drive performance monitor can generate EWMA detector values and residual values, which help make a decision on whether the drive is detected as "slow." The last value of the EWMA and the several last values (e.g., the last seven values) of the residual can be saved to be executed during the next iteration.

Following operation 324, operations 336 and/or 326 may follow, according to various embodiments. At operation 336, it may be determined whether any drive is flagged (e.g., as slow). If no drive is flagged at operation 336, then it may be determined whether any host remains at operation 342. After determining if any drive is flagged at operation 336, then an event can be created at operation 338, and the applicable drive information can be transmitted to a drive monitor, either locally or remotely, e.g., using a remote log. Following operation 336, it may then be determined whether any host remains at operation 342.

Operation 326 preferably follows operation 324, and it may be determined at operation 326 whether the relevant database exists. If the relevant database is found to not yet exist at operation 326, such database may be created at operation 328.

Following assurance that the database exists at operations 326 and optionally 328, it may be determined whether the database is corrupted at operation 330. If the database is found to be corrupted at operation 330, it may be repaired at operation 332, as appropriate and by various methods or techniques. Following the assurance that the database exists and is not corrupted at operations 326, 328, 330, and 332, the data may be saved in the database at operation 334. Relevant data can be saved to be sent via machine-reported product data (MRPD) (e.g., IBM MRPD) at operation 340. Of note, MRPD data can be saved whether or not a drive is flagged at operation 336. Following the saving of the data to the database at operation 334, including the saving of relevant data to be sent via MRPD at operation 340, it may be determined whether any host remains.

At operation 342, if it is found that at least one host remains, then the process may perform operation 314 again reading the I/O statistic data from the drive monitor, and the process may repeat. Following operation 342, if no hosts remain, old drives (e.g., older than 30 days, etc.) can be removed from the database at operation 344. Following operation 344, any flagged drive(s) can be saved to an accessible file (e.g., a JSON format file accessible by a provider). Then, process 300 may end.

Figure 4:
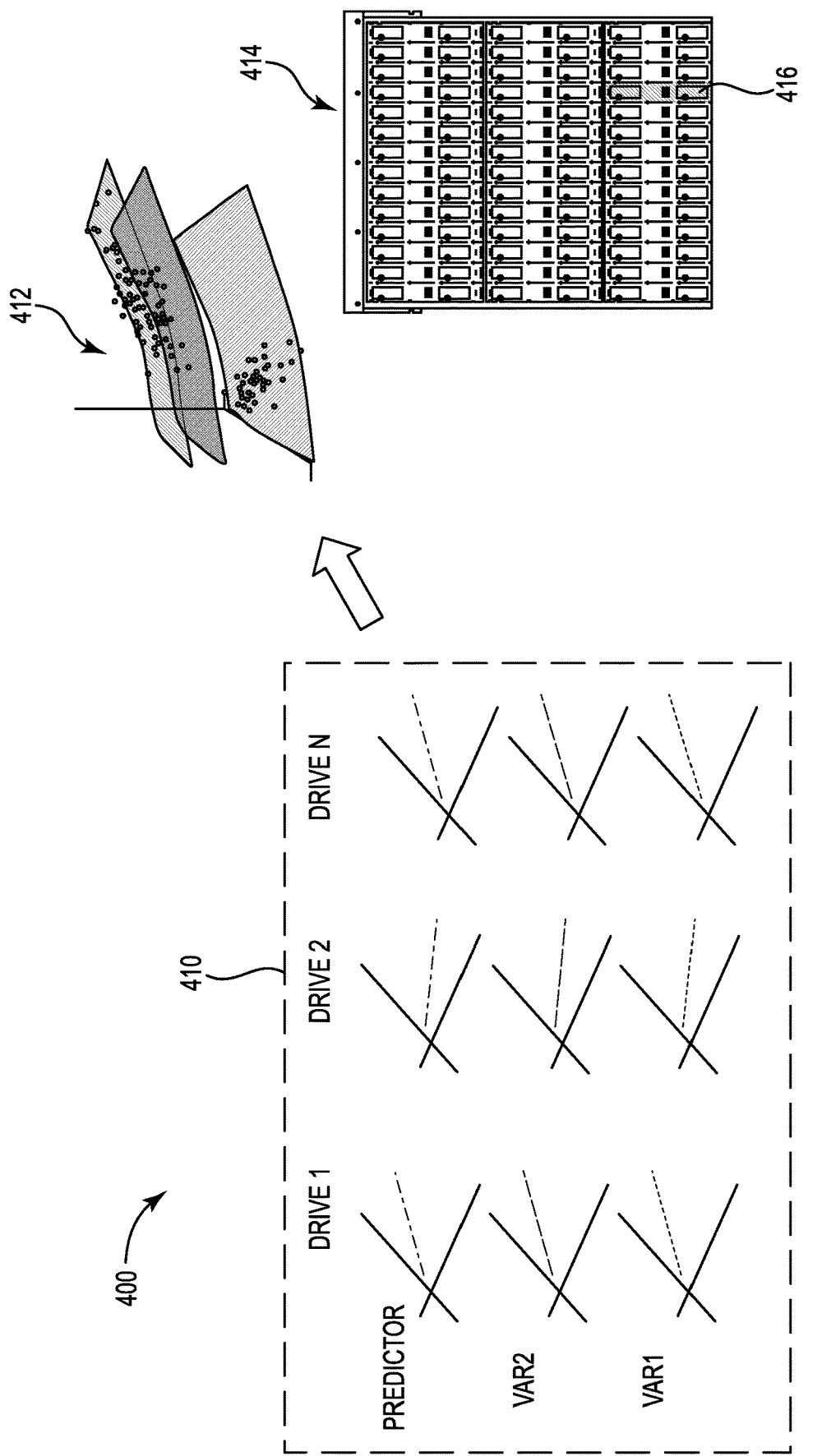
FIG. 4 illustrates a visualized comparison of multiple drives, according to various embodiments.

FIG. 4 illustrates a visualized comparison 400 of multiple drives, according to various embodiments.

The performance of various drives can be compared (e.g., N drives) according to various received or measured drive performance aspects, as described above. The various drive performance aspects can be interpreted, organized, and represented visually and graphically, as shown at chart 410. Variable 1 (VAR1) and variable 2 (VAR2) represent two example variables or aspects in drive performance and data, which together can form a composite model or formula called a predictor (shown at top). The predictor can then be used to assess various drives found to be comparable according to various drive performance aspects, for example by grouping data points together for various variables (VAR1, VAR1, and PREDICTOR). A linear regression can then be employed on all data points to determine a slope value for VAR1 points, VAR2 points and a PREDICTOR, respectively. Optionally, instead of a linear regression, a mean or other calculated average of the data points could be employed to determine the predictor.

According to chart 410, the data is depicted in two visual dimensions, but more dimensions of data may also be interpreted and/or displayed at one time. For comparative analysis across multiple drives, a dynamic model for each drive can provide data points that together define an acceptable performance hyperplane, possibly one or more three-dimensional-based hyperplane, shown at chart 412. The hyperplane(s) may then allow a comparison of drive performance for drives, including by matching drive type, drive model, and/or drive I/O pattern(s). A drive that violates a performance pattern may then be caught by a sensor or detected visually, for example by a user. If a sensor is used, the sensor can be tuned to emphasize fast detection or consistent degradation, according to various embodiments.

Access to various drives 416 (e.g., including a drive enclosure) being monitored or otherwise, including inner workings of such drives 416, can occur at a server blade or mainframe rack 414 level. The drives 416 being assessed and monitored can be located in the rack 414. In some embodiments, in-situ (i.e., in place) drive monitoring calibration can occur by modeling to account for workload type (e.g., sequential or random) and performance fluctuations deemed to be insignificant.

Figure 5:
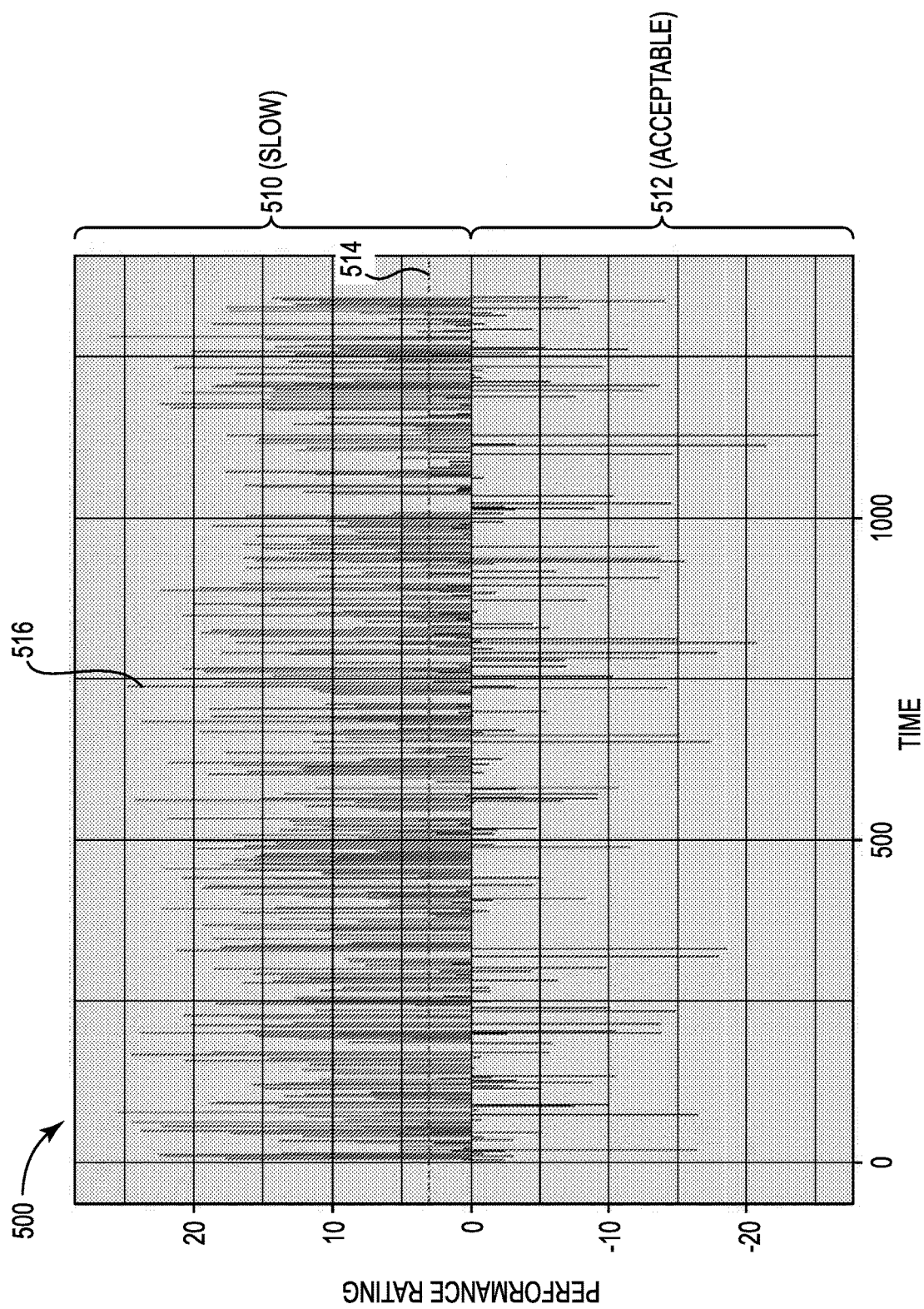
FIG. 5 is a drive performance chart for a single drive over time, according to various embodiments.

FIG. 5 is drive performance chart 500 for a single drive over time, according to various embodiments.

A drive's performance can be rated and graphed over time. Chart 500 visually depicts a drive's relative performance over time, starting at time=0. An individual snapshot of the drive's performance, for example bar 516, shows how the drive was performing at that moment along a timeline shown on the X-axis, according to one or more metrics. As shown, data points located above the performance baseline (zero) 510 represent times when the drive was not performing as well. At 512, the data point located below the performance baseline represent times when the drive was performing well. The average performance metric of the drive is represented at dashed line 514, shown as a horizontal line. Average performance of the subject drive, as shown at dashed line 514, is above the performance baseline, as shown, indicating that the drive's average performance is subject to some performance degradation or issues.

Figure 6:
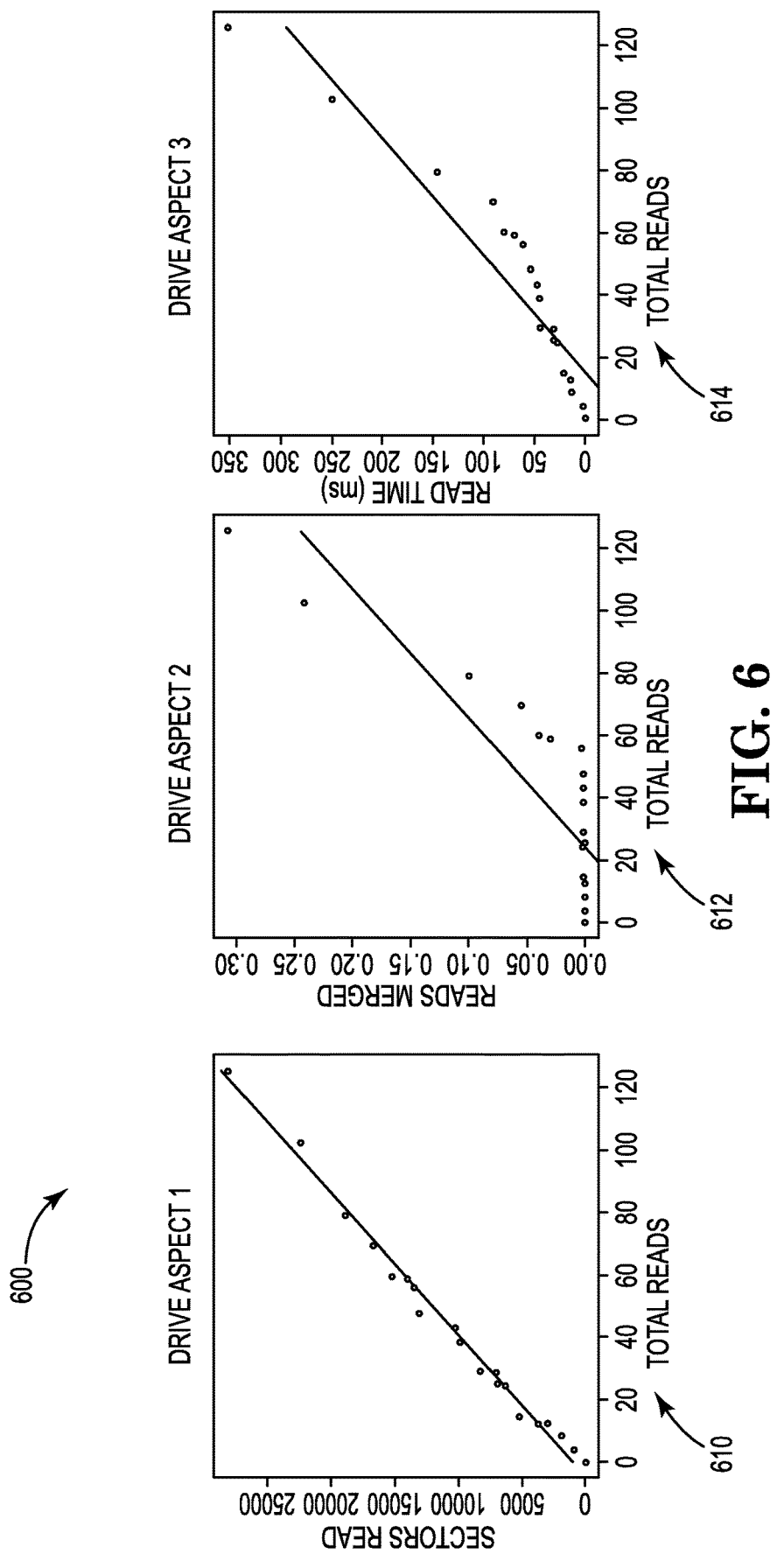
FIG. 6 illustrates example drive data points and respective functional fit lines based on various drive aspects, according to various embodiments.

FIG. 6 illustrates example drive data points and respective functional fit lines 600 based on various drive aspects, according to various embodiments.

As described herein, slow drive behavior can be detected within drive clusters. To detect slow drive behavior, I/O statistics variables associated with read/write workloads can be monitored. In some embodiments, various drive aspects and read/write workload models can be determined, analyzed, and/or formed using regression techniques, such as linear regression. It is also contemplated that generated read/write workload models can be combined using adaptive performance metrics.

Various features or drive performance aspects of monitored drives can be plotted and then functionally fit (e.g., using linear regression), either individually or in combination in order to create a predictor function or representation, as shown. A first drive aspect (sectors read compared to total reads) is shown at 610, having a series of sections read on the Y-axis plotted against total reads on the X-axis. A functional fit line then is shown as a linear approximation of the sections read plotted against the total drive reads. In a similar fashion, at 612, a second drive aspect (reads merged compared to total reads) is plotted on the Y-axis against total reads on the X-axis, along with a functional fit linear fit. At 614, a third drive aspect (read time compared to total reads) is plotted on the Y-axis against total reads on the X-axis, along with a functional (e.g., linear) fit.

In some embodiments, by composing the first, second, and/or third drive aspects (e.g., sections read and reads merged) together at, a composite, linear functional fit can be output, creating a predictor function by which to assess a drive's overall performance according to more than one drive aspect. The functional fit lines 600 of FIG. 6 can be related to FIG. 4 in that FIG. 6 represents drive data for a single drive, whereas FIG. 4 represents N drives, each of which may be included in the illustration.

In some embodiments, workload model residual values can be monitored using an exponentially-weighted moving average (EWMA) detector. Various decision rules can be based on one or more adaptive simulation analyses (e.g., Monte Carlo), which can control annual false alarm rates to a prescribed level (e.g., 1%). Embodiments can interpret and compensate for multiple known data irregularities. Embodiments are designed to run on one cluster at a time, making it scale better than existing solutions. In some cases, simulated examples can be provided to investigate the detector's sensitivity prior to evaluation of actual drives.

In some embodiments, a drive or systems manager can be used to monitor drive disk statistics using OS (e.g., Linux) kernel tools. Table 1, below, lists example drive I/O statistics corresponding workload model usage.

TABLE 1

| Field | Variable | Workload Model |
|---|---|---|
| 1 | Total Reads | Read Model |
| 2 | Reads Merged | Read Model |
| 3 | Sectors Read | Read Model |
| 4 | Read Time (ms) | Read Model |
| 5 | Total Writes | Write Model |
| 6 | Writes Merged | Write Model |
| 7 | Sectors Written | Write Model |
| 8 | Write Time (ms) | Write Model |
| 9 | I/O in Progress | Not Recorded |
| 10 | I/O Time (ms) | Not Used |
| 11 | Weighted I/O Time (ms) | Not Used |

Various drive I/O statistics, for example according to Table 1, can be measured, stored, and classified by hour within a single day. Alternatively other time periods can be used, or drive I/O statistics can be analyzed continuously, according other embodiments. If hours are used for analyzing drive's daily performance, an example slow drive detector can use the last [24+1] hours of I/O statistics data to make classifications. As a day has 24 hours, in order to have complete data (including interpolation) for all 24 hours, a $25^{th}$ hour can be added for statistical usage.

During data processing if various I/O statistics and/or drive data, multiple data irregularities can occur and may preferably be accounted for (e.g., in preprocessing). A first data irregularity that may be accounted for during data preprocessing includes integer overflow and wrap. Integer overflow and wrap can generally be resolved by rescaling all fields by a factor (e.g., by $10^3=1,000$). Another irregularity can include decreasing I/O statistics fields. All recorded I/O statistics fields should preferably be non-decreasing. However, server restarts can reset I/O statistics values. Workload metrics can be aggregated, and can grow monotonically, instead of decreasing. In some cases, if a host server is rebooted or power cycled, a counter associated with workload metrics and data can be reset. Anomalies relating to decreasing/non-decreasing I/O statistics fields can be checked and corrected during preprocessing.

Another irregularity can include inconsistent database records. Recorded values stored in the systems manager database (in some embodiments a document-oriented database) can be irregular in frequency across fields. If present and found, this irregularity can be first addressed by performing a linear interpolation on 24 hours of I/O statistics values with nodes spaced an hour apart, hence the preferred embodiment employing the 24 hours of a day plus an additional one hour of data. The additional hour can be used to improve estimation of the leftmost endpoint. It is possible for some variables to have less than 24 hours of data, in which case all workload model variables may be reduced to the shortest variable size before passing to the feature selection step.

Another potential data irregularity can include inconsistent I/O statistics records. I/O statistics are generally updated when resources are available, which can lead to update delays for some fields. Feature selection can be employed to help "smooth out" observed delays, as well as some of the inconsistencies described, above. Another potential data irregularity can include a unique drive "product ID" and OS drives. Product specification can be a useful predictor of drive performance. Therefore, product IDs can preferably be used to partition and compare similar drives. In addition, OS drives, which often tend to behave differently, can be filtered prior to a modeling procedure. Yet another data irregularity can include insufficient data. Insufficient data can occur in one or more of the following ways, among others. First, a particular drive can have a read/write workload too low to produce a reasonable estimate. If a drive falls below the prescribed workload threshold (e.g., two seconds) no drive classification may be made. Second, if after variable interpolations a particular drive has too short a time window available (e.g., less than six hours of data) then no drive classification may be made. Third, if too few drives have sufficient data available (e.g., may need ten or more drives) then no classifications may be made for any of the drives.

Feature selection can be conducted for both data reduction as well as a response to the data irregularities, described above. Total operations may be highly correlated with total sectors, total time, and total merges for both reads and writes. In order to discount irregularities, focus may preferably be placed on global trends. Hence simple linear regressions are preferably used to reduce the data. Specifically, total sectors, merges and time are regressed on total operations for both reads and writes. The trends (slopes) can be stored for use in the final workload models. As shown, FIG. 6 includes and illustrates feature extraction for three drive aspects for one particular drive.

For both read and write feature sets, time trends can preferably be regressed on second order polynomial expansions of sector and merge trends. The second order polynomial expansion can include regressors, their squares, and their interactions. The standardized residuals can be recorded for both workload models. Standardized residuals can preferably be standardized by an estimate of variance. The standardized residuals may then be combined by a weighted average proportional to the modeled R-square values. In other words, more weight is given to the model which currently has better explanatory performance. Large, positive residuals may be indicative that a drive is trending comparatively slower given the corresponding observed sector and merge trends.

Figure 7:
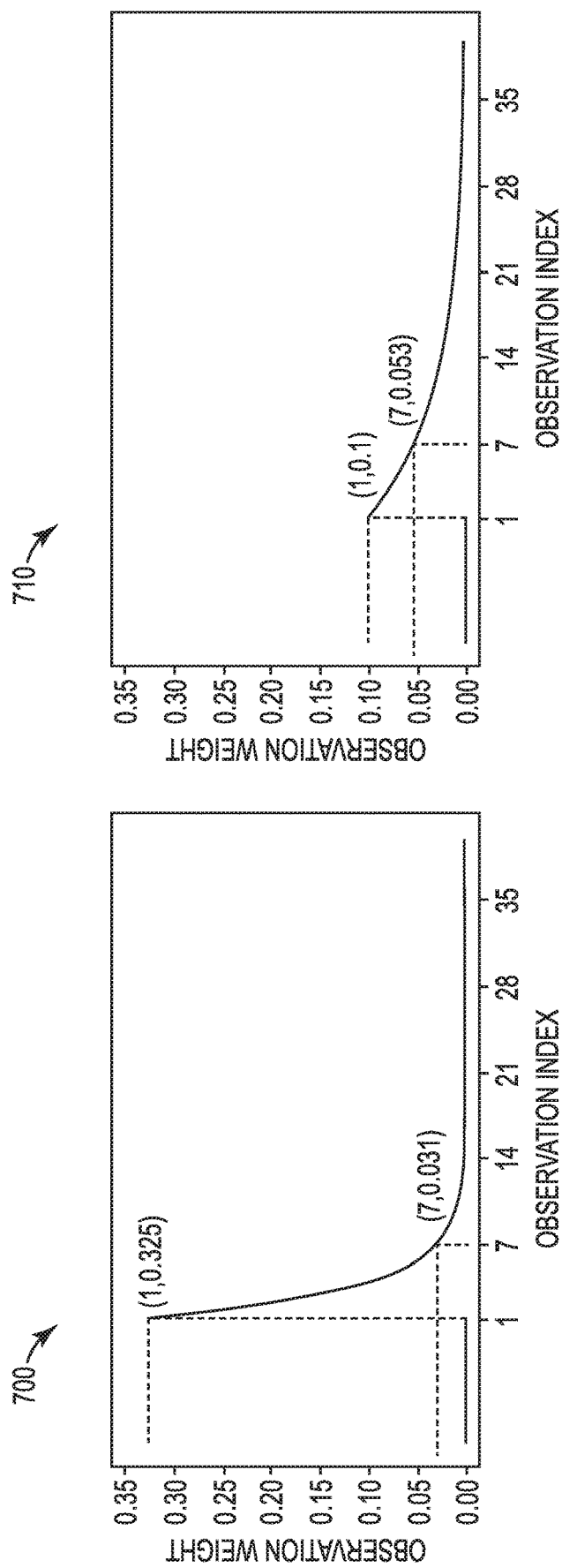
FIG. 7 illustrates EWMA weight functions, with two different exponential decay parameters, according to various embodiments.

FIG. 7 illustrates EWMA weight functions, with two different exponential decay parameters, according to various embodiments.

As discussed, a drive can be labeled as slow when an EWMA detector finds that a chosen critical value is exceeded. The threshold may be preselected or determined based on various parameters and/or may be chosen based on a simulation analysis (e.g., Monte Carlo). The simulation can include obtaining and combining the most recent residual values (K) for drive(s) under consideration.

When a drive's EWMA detector value exceeds the determined, simulated critical value, if it is determined (or assumed) that the drive data under consideration is from a homogeneous distribution, the flagged drive's current clustering of residuals would happen at least once during the course of one-year by chance alone only one percent of the time.

Provided sufficient data, workload models can preferably produce a combined residual for each day (24 hours). The combined residual series for each drive can then be monitored using an EWMA detector. According to preferred embodiment, the detector $D_t$ can filter the residual series $\epsilon_t$ using the following recursion:

$$D_t = \gamma \epsilon_t + (1-\gamma) D_{t-1}, D_0 = 0 \text{ and } \gamma \epsilon(0, 1).$$

In the above, gamma ($\gamma$) is the exponential decay parameter for the moving average weight function.

Time-based weight functions can vary with differing $\gamma$ parameters. Smaller $\gamma$ values can correspond to longer memory weight functions, slower detection times, and higher sensitivity to smaller deltas. In one example, 93.6%/6.0%/0.4% of the weight is given to observations in days (1-7)/(8-14)/(15+). In a second example, the weight given can instead be split as 52.2%/25.0%/22.8%. One example and preferred implementation uses $\gamma$=0.325, as shown at 700. Example 700 may use seven observations (e.g., residual value K=7), since if gamma ($\gamma$)=0.325, a majority of the weight would be placed on just the last seven observations.

A difference of a gamma value ($\gamma$) from the relevant fit may be considered a residual or residual value. An example residual is shown in FIG. 5, and is the distance from each value bar 516 from the dashed line (average drive performance) 514. Residuals may be randomly sampled (e.g., with replacement) and a one-year detector series for a large number of drives can be created (e.g., 10,000 drives). A critical value to control for a prescribed annual false alarm rate can then be determined and/or employed (e.g., 1%).

A second example 710 is shown where $\gamma$=0.1. As outlined, above, the gamma values can be selected as desired to give more weight to more recent events (for instance, a larger $\gamma$ value, 0.325 as shown in the example at 700), versus equal weight to recent and historic events (smaller $\gamma$ value, as shown at 710). Various other $\gamma$ values and time-based weighting schemes are also contemplated.

Figure 8:
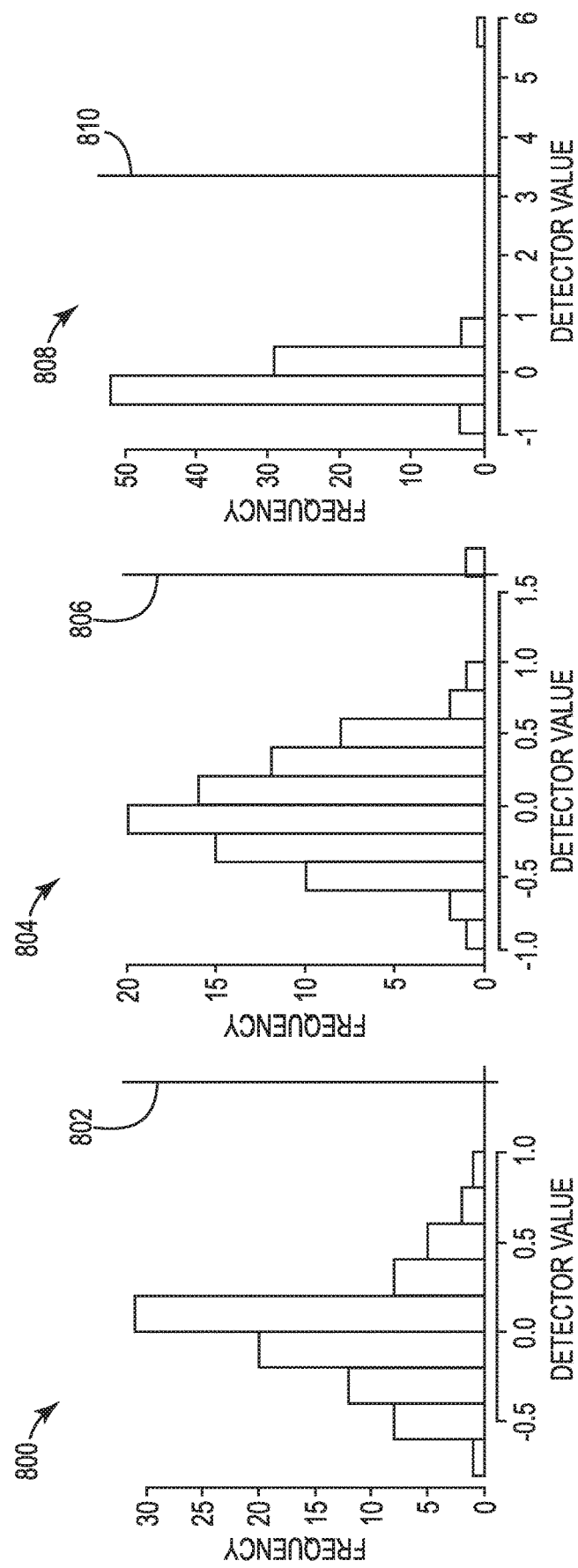
FIG. 8 shows various examples of drives read/write performance monitoring according to various circumstances.

FIG. 8 shows various examples of drives read/write performance monitoring according to various circumstances.

Various test example histograms 800, 804, 808 are shown. The graphs visualize example drive detector values after one week, under three different possible scenarios. Histogram 800 represents a reading where no drives are considered slow, and may be used as context for a control (e.g., a null case). Histogram 800 includes a vertical line, which represents a selected critical value 804. The critical value 804 in this case shows there currently are no drives detected as slow. If histogram 800 represents a test or artificial scenario, critical value 804 shows that this case lacks any false positives. The critical value can be based on actual predictor values. The determination and selection of critical values may not be immediately transparent from the graphs, as values can be re-centered to the mean predictor (e.g., zero) over time. In some embodiments, the normalization of the critical value can make the fitting process more reliable. Histogram 804, as shown, shows that one drive is detected as slow by 10%, based on critical value 806. Histogram 808 shows that one drive is detected as slow by 100%. In all shown cases, the systems monitor correctly classifies the drives.

FIG. 9 is a representation of storage device information 900 shown once extracted from an example storage device during a monitoring stage 110 (see FIG. 1), according to various embodiments.

When a drive performance anomaly is detected (e.g., by a systems monitor program or data collection system [DCS], such as Zabbix), the related drive data can be sent through a systems monitor configured to manage large groups of computers running various OSs, providing system administration, control, and various other functionality, (e.g., IBM Endpoint Manager [IEM] or IBM BigFix) and corresponding MRPD. The systems (e.g., drive performance) monitor would then preferably save data between runs, saving the data to a database, as described herein.

Received drive data to be analyzed by the drive performance monitor can be collected through various I/O statistics collection methods. A computer system monitor (e.g., iostats) may be used to collect and show (e.g., OS storage and/or drive) I/O statistics. An example of collected drive data 900 for an example drive is depicted in FIG. 9. Disk stats can exist and be stored independent of data collection tool (e.g., Zabbix) and file format (e.g., JSON), according to some embodiments. The computer system monitor may preferably access Unix-based OSs, such as Linux, but the concepts herein may equally apply to other computer system monitor examples. I/O statistics results can be from the nodes using data collection systems and can then be formatted, as desired.

FIG. 10 is a table 1000 with example fields based on a process run on a drive, according to various embodiments.

According to embodiments, a DCS collector (e.g., Zabbix) can be used to retrieve low-level information and present that data into a hierarchy in the DCS collector cache. A device can be assigned a device name (or number), for tracking of that device when compared to other devices. Examples of data that may be collected for each device includes, for example, the amount of time spent reading (read_time_ms), reads merged (reads_merged), sectors read (sectors_read), total reads completed successfully (total_reads), time spent writing (write_time_ms), writes merged (writes_merged), sectors written (sectors_written), time spent doing I/O operations (io_time), weighted time spent doing I/O operations (weighted_io_time), and total writes (total_write), among others. For example, this information can be extracted from a disk statistics file (e.g., /proc/diskstatsfile) that contains various info. The file can be found or stored at an index (e.g., /proc/diskstats), and should preferably be readable for all users, according to various embodiments.

In some embodiments, a name of one or more device may be associated or matched with an enclosure and/or drive number (see also FIG. 4). A drive number can include a drive slot number. A hardware platform interface (HPI) inventory can store and provide an associated number of a slow drive. The HPI can also store and provide a worldwide number (WWN) of the drive. In some embodiments, a logical SCSI command can give associated WWN to drive name(s). In some embodiments, a logical SCSI (e.g., lsscsi, a command that lists information about SCSI devices) command can be used, which may be similar to what is done for a known drive health collection process. A logical SCSI command may utilize a disk-device mapping parser and a disk-device mapping container, according to various embodiments. By matching results from HPI inventory and the logical SCSI command drive name(s)/ID(s) can be mapped by slot number.

For a particular drive cache layout, in order to be consistent with what is currently available in a drive monitor collector cache we can add various discovery files to a corresponding storage device directory, which may be organized by storage device enclosure identifier, such as a serial number. Preferably there should be multiple discovery files. The discovery files should preferably contain a component index as well as a sensor name for each of the discovered sensors. Discovery files can be used by a DCS (e.g., Zabbix) to recover information from the DCS collector. In some embodiments, a positive integer can be classified as an unsigned integer (UINT). Examples of discovery files include discovery.float, holding floating point values, discovery.int, holding integer-based values, discovery.string, holding string-based values, and discovery.uint, holding UINT values.

An example discovery.uint file:

```
{
    "data": [
        {"{#UINT_ITEM_NAME}": "read_time_ms",
         "{#COMPONENT_INDEX}": "0"},
        {"{#UINT_ITEM_NAME}":
         "write_time_ms","{#COMPONENT_INDEX}": "0"},
        { "{#UINT_ITEM_NAME}": "reads_merged",
```

-continued

```
         "{#COMPONENT_INDEX}": "0"},
         ..........
    ]
}
```

According to some embodiments, in to gather drive data, a process can performed per enclosure to reduce the likelihood of an undesirable data overload. According to one embodiment, the I/O statistics data of the last twenty-five hours with one point every hour (e.g., using a Zabbix JSON application programming interface [API]) can be gathered. The data can then be returned in a JSON format and should contain the following fields, as shown.

The drive aspect variable 1010 is shown at top, along with corresponding item key 1012. Serial number (serial_number) and corresponding item key are shown at 1014 as one example. Data saved during the previous run (including, e.g., EWMA and residuals) that is read from a database (e.g., an SQLite database) can be utilized. To begin, it may be determined whether the database both exists and contains data, as described with respect to FIG. 3, above.

In a preferred embodiment using a Zabbix DCS and a JSON API, data returned from the query can then preferably be formatted into a JSON and matched to the data from Zabbix, e.g., by drive serial number. If a drive serial number gathered from Zabbix does not match any drive in the database, the drive may have been replaced. If the drive has been replaced, the drive slot location should be checked, and the entire row of data in the database can be replaced.

FIG. 11 is a representative table layout of saved data 1100 following the running of a described process on a drive, according to various embodiments. FIG. 11 shows information that is saved for each row and the results of the table contain columns 1110. Column descriptions are given by 1112 and column types are given by 1114. Each data entry is one of each column.

After running a drive monitoring process, as described herein, the resulting data can be saved in the database. The data can preferably be saved to a database on a per-drive basis (e.g., one row per drive). A new row may then be created in the disk performance monitor database for each drive (e.g., disk_performance_monitor) for each drive, as needed. The table results contain columns for data name 1110, explanation 1112, and type 1114. One example data entry for serial number (name 1110: serial_number) 1116 is shown, including the explanation 1112 that the serial number is the drive's serial number, along with the data type 1114 of string. An example of data entries is shown at Table 2, below.

TABLE 2

| SERIAL_NUMBER | ENCLOSURE_SERIAL_NUMBER | TYPE | INDEX | ID | ANOMALY DETECTED |
|---|---|---|---|---|---|
| YFH7T8BD | SHX0969011Y01P3 | DISK | 0 | SHX0969011Y01P3:DISK:0 | 1 |
| YFH5S8BD | SHX0969011Y01P3 | DISK | 80 | SHX0969011Y01P3:DISK:80 | 0 |
| YFH7T9CD | SHX0969033Y01P3 | DISK | 0 | SHX0969033Y01P3:DISK:0 | 0 |

| SERIAL_NUMBER | TIMESTAMP | EMWA | RESIDUAL0 | ... | RESIDUAL7 |
|---|---|---|---|---|---|
| YFH7T8BD | 1492025423 | 2.7 | 3.2 | | 1.8 |
| YFH5S8BD | 1492025423 | −0.26 | −0.5 | | 0.1 |
| YFH7T9CD | 1492025423 | 0.1 | 0.1 | | 0.1 |

FIG. 12 is a JSON code data array 1200 with one entry per storage device that has been flagged as slow, according to various embodiments.

According to the shown JSON code data array 1200, the value for "EWMA" is greater than 2, indicating a slow drive. Accordingly the value for "ANOMALY_DETECTED" is 1, therefore a drive has been properly tagged as slow. When a drive performance aspect anomaly is detected, the corresponding information can preferably be saved as a JSON file, for example as a code data array 1200. The saved JSON file may be later recovered by the MRPD app and may be sent to call home. Data from all drives is sent through MRPD, whether there was a drive detected as slow or not. The JSON file contains a header field with the format version and a data array that contains a data array for "anomalous_drives" and a data array for "normal" drives. A separate JSON file is saved containing only information on the flagged "slow" drives. This information can be recovered by a data provider in various programming languages, e.g., PLEX. In an alternative case where a drive is not slow, the EWMA value could be less than 1.0, and may be negative in some embodiments (e.g., −0.2697, etc.), and the ANOMALY_DETECTED (binary) value would be 0 (i.e., not slow, not anomalous), instead of 1 (i.e., slow, anomalous).

The data file can be saved in a library or directory (e.g., /mnt/mgmt/var/lib/disk_performance_monitor/). A configuration management tool (e.g., Puppet) can then confirm that the library or directory exists and the necessary permissions (e.g., 755 zabbix:zabbix) have been properly and sufficiently granted. The directory may preferably also contain the associated database.

The drive performance monitor executable can be located in a local user binary file (BIN) directory (e.g., /usr/local/bin) and can be run at various intervals every day (e.g., a "cron" job), such as once a day, as described herein. A package management utility (e.g., Red Hat Package Manager [RPM]) based package (named, e.g., python27-pandas) may then be created to install the appropriate library. "Pandas" may denote a Python library for data frames. An RPM package installing the python statsmodels library must be created. An RPM package installing a python numpy library may also be created. An RPM package may be created which copies the drive performance monitor script to the right location and install the required libraries or packages. It can includes dependencies on python2.7-pandas>=0.16.2, python2.7-statsmodels, python2.7-numpy and the python-sqlite library. In some embodiments, the permissions on the directory can be, for example, 755 root:root. DPM depends on the following python libraries for which RPM packages may be created if not already available from standard RPM REPOS: numpy>=1.7.1, pandas>=0.17.1, statsmodels, according to various embodiments.

Below is an example of systems management software pseudo code (Code Example 1) that may be sent to a user upon a determination that a storage device is slow, according to various embodiments.

---
CODE EXAMPLE 1
---
```
"data": [
    {
        "anomalous_drives": [
            {
                "R": 3.5283614132999999,
                "anomaly_detected": 1,
                "enclosure_serial_number": "SHX0979508Y00VV",
                "ewma": 3.2785488983,
                "id": "SHX0979508Y00VV:disk:60",
                "index": "60",
                "product_name": "ST4000NM0023",
                "read_time_ms": 705.60418544799995,
                "reads_merged": 1.3569017836999999,
                "residual0": 3.3750474163000002,
                "residual1": 3.5141530662,
                "residual2": 4.1771326176999999,
                "residuaL3": 4.4041950448999998,
                "residual4": 1.8541904380000001,
                "residual5": 1.3675759852,
                "sectors_read": 684.75984925729995,
                "sectors_written": 408.59303596230001,
                "serial_number": "Z1Z3KV5H00009433XZN5",
                "timestamp": 1491935121,
                "type": "disk",
                "write_time_ms": 38.123864222800002,
                "writes_merged": 11.3259749181
            }
        ],
        "drives": [
            {
                "R": 0.35479057069999997,
                "anomaly_detected": 0,
                "enclosure_serial_number": "SHX0979508Y00VV",
                "ewma": 0.29016359479999998,
                "id": "SHX0979508Y00VV:disk:0",
                "index": "0",
                "product_name": "ST4000NM0023",
                "read_time_ms": 192.52047037060001,
                "reads_merged": 1.212084556,
                "residual0": 0.37562517039999999,
                "residual1": 0.50158828280000001,
```

---
CODE EXAMPLE 1
---
```
                "residual2": 0.48326435909999998,
                "residual3": -0.49492969879999998,
                "residual4": -0.11979668659999999,
                "residual5": 0.17458113780000001,
                "sectors_read": 635.87249329190001,
                "sectors_written": 394.19169658200002,
                "serial_number": "Z1Z3RTFE0000C4382406",
                "timestamp": 1491935121,
                "type": "disk",
                "write_time_ms": 27.98581677,
                "writes_merged": 10.9086915851
            },
...
```

If a drive is detected as slow, a systems management software instance (e.g., IEM) can be created and sent to a user. The systems management software can be sent at the same time the data is added to the (e.g., JSON) file described herein. The systems management software can access and be used to store and organize the information that is saved in the file.

For MRPD collection, a script can retrieve the file saved by the drive performance monitor package to be saved in a tape archive (TAR) file sent by MRPD. This will be driven by a new configuration file that will drive this new script. For the collection of MRPD statistics data, in order to reproduce the findings of the process at home we would have to send MRPD data each time the script is run (e.g., once a day).

For each drive we would retrieve some or all of the following information, preferably including six I/O statistics variables; read time, reads merged, sectors read, write time, writes merged, and/or sectors written). At each run the history data (e.g., over the last twenty-four hours) of each of these variables can be fitted to give one point per drive per I/O statistics variable.

A unique drive product ID or name (e.g., a serial number) can used in order to facilitate comparing various drives with similar product IDs. Data from the previous run: EWMA, and preferably a maximum of six residual values can also be included, equaling about twenty-one data points per drive per day, as described. In addition, at least some metadata can be retried, such as the time window the process used and various constants of the process. Examples of metadata may include: EWMA parameter, number of days to simulate for each drive, number of artificial drive cases to simulate, rate of false alarm for one drive in the course of number of days to simulate each drives, criteria for change in read and write time, minimum number of points needed to fit feature models, minimum number of drives needed to fit the final residual model, minimum number of drives with the same product ID. The preceding metadata may be included as additional data points, according to various embodiments. This information can be saved in a JSON file produced by the drive performance tool which may be gathered by MRPD at a later point in time.

In addition, if a drive is detected as slow, an IEM can be created and can be transmitted to a user in various forms. The IEM can be sent at the same time the data is added to a JSON file, as described herein. The IEM may contain the information that is saved in the JSON file.

Figure 13:
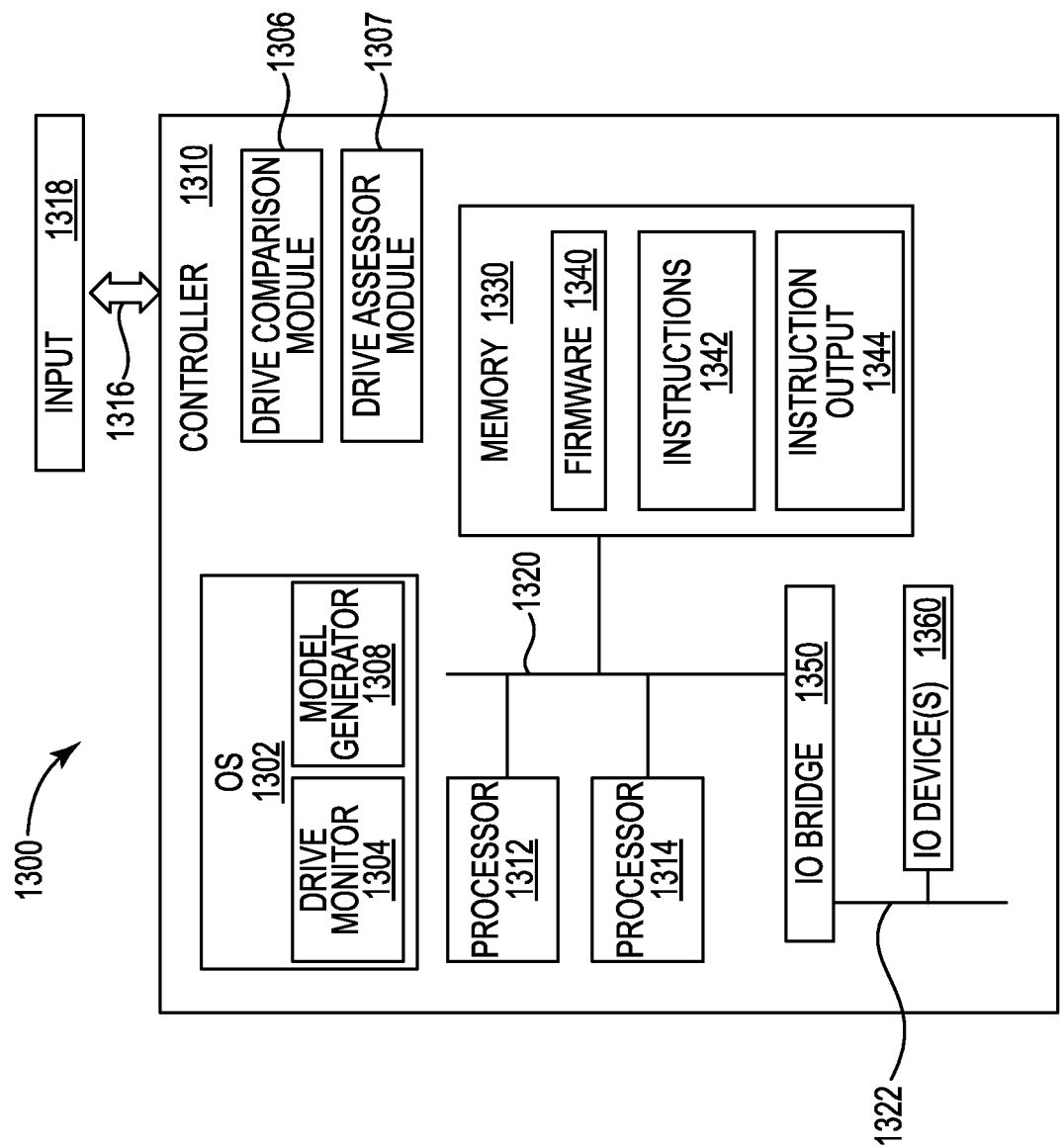
FIG. 13 is a block schematic diagram of a computer system, according to various embodiments.

FIG. 13 is a block schematic diagram of a computer system according to embodiments of the present disclosure.

Computer system 1300, as shown, is configured with an interface 1316 to enable controller 1310 to receive a request to manage a drive performance monitor, as described in particular with regard to FIGS. 1-3. An input 1318 may be received at interface 1316. In embodiments, the interface 1316 can enable controller 1310 to receive, or otherwise access, the input 1318 via, for example, a network (e.g., an intranet, or a public network such as the Internet), or a storage medium, such as a disk drive internal or connected to controller 1310. The interface can be configured for human input or other input devices, such as described later in regard to components of controller 1310. It would be apparent to one of skill in the art that the interface can be any of a variety of interface types or mechanisms suitable for a computer, or a program operating in a computer, to receive or otherwise access or receive a source input or file.

Processors 1312, 1314 included in controller 1310 are connected by a memory interface 1320 to memory device or module 1330. In embodiments, the memory 1330 can be a cache memory, a main memory, a flash memory, or a combination of these or other varieties of electronic devices capable of storing information and, optionally, making the information, or locations storing the information within the memory 1330, accessible to a processor. Memory 1330 can be formed of a single electronic (or, in some embodiments, other technologies such as optical) module or can be formed of a plurality of memory devices. Memory 1330, or a memory device (e.g., an electronic packaging of a portion of a memory), can be, for example, one or more silicon dies or chips, or can be a multi-chip module package. Embodiments can organize a memory as a sequence of bit, octets (bytes), words (e.g., a plurality of contiguous or consecutive bytes), or pages (e.g., a plurality of contiguous or consecutive bytes or words).

In embodiments, computer 1300 can include a plurality of memory devices. A memory interface, such as 1320, between a one or more processors and one or more memory devices can be, for example, a memory bus common to one or more processors and one or more memory devices. In some embodiments, a memory interface, such as 1320, between a processor (e.g., 1312, 1314) and a memory 1330 can be point to point connection between the processor and the memory, and each processor in the computer 1300 can have a point-to-point connection to each of one or more of the memory devices. In other embodiments, a processor (for example, 1312) can be connected to a memory (e.g., memory 1330) by means of a connection (not shown) to another processor (e.g., 1314) connected to the memory (e.g., 1320 from processor 1314 to memory 1330).

Computer 1300 can include an input/output (I/O) bridge 1350, which can be connected to a memory interface 1320, or to processors 1312, 1314. An I/O bridge 1350 can interface the processors 1312, 1314 and/or memory devices 1330 of the computer 1300 (or, other I/O devices) to I/O devices 1360 connected to the bridge 1320. For example, controller 1310 includes I/O bridge 1350 interfacing memory interface 1320 to I/O devices, such as I/O device 1360. In some embodiments, an I/O bridge can connect directly to a processor or a memory, or can be a component included in a processor or a memory. An I/O bridge 1350 can be, for example, a peripheral component interconnect express (PCI-Express) or other I/O bus bridge, or can be an I/O adapter.

An I/O bridge 1350 can connect to I/O devices 1360 by means of an I/O interface, or I/O bus, such as I/O bus 1322 of controller 1310. For example, I/O bus 1322 can be a PCI-Express or other I/O bus. I/O devices 1360 can be any of a variety of peripheral I/O devices or I/O adapters connecting to peripheral I/O devices. For example, I/O device 1360 can be a graphics card, keyboard or other input device, a hard disk drive (HDD), solid-state drive (SSD) or other storage device, a network interface card (NIC), etc. I/O devices 1360 can include an I/O adapter, such as a PCI-Express adapter, that connects components (e.g., processors or memory devices) of the computer 1300 to various I/O devices 1360 (e.g., disk drives, Ethernet networks, video displays, keyboards, mice, styli, touchscreens, etc.).

Computer 1300 can include instructions executable by one or more of the processors 1312, 1314 (or, processing elements, such as threads of a processor). The instructions can be a component of one or more programs. The programs, or the instructions, can be stored in, and/or utilize, one or more memory devices of computer 1300. As illustrated in the example of FIG. 13, controller 1310 includes a plurality of programs or modules, such as drive comparison module 1306 and drive assessor module 1307. A program can be, for example, an application program, an operating system (OS) or a function of an OS, or a utility or built-in function of the computer 1300. A program can be a hypervisor, and the hypervisor can, for example, manage sharing resources of the computer 1300 (e.g., a processor or regions of a memory, or access to an I/O device) among a plurality of programs or OSes.

Programs can be "stand-alone" programs that execute on processors and use memory within the computer 1300 directly, without requiring another program to control their execution or their use of resources of the computer 1300. For example, controller 1310 includes (optionally) stand-alone programs in drive comparison module 1306 and drive assessor module 1307. A stand-alone program can perform particular functions within the computer 1300, such as controlling, or interfacing (e.g., access by other programs) an I/O interface or I/O device. A stand-alone program can, for example, manage the operation, or access to, a memory (e.g., memory 1330). A basic I/O subsystem (BIOS), or a computer boot program (e.g., a program that can load and initiate execution of other programs) can be a standalone program.

According to some embodiments, a systems monitor (e.g., drive monitor 1304) (e.g., a systems management system) for monitoring drive performance may include various scripts that may represent programs or other functions. An example script may be a (e.g., stand-alone) program that can be run once per time period (e.g., daily). The script can be configured to fetch relevant data from a monitoring program for networks and applications in a data interchange format (e.g., JavaScript Object Notation [JSON]) application programming interface (API) directly. Monitoring programs can preferably be enterprise and/or open source, according to various embodiments. One preferred monitoring program or DCS contemplated by this disclosure is Zabbix, as described herein.

Controller 1310 within computer 1300 can include one or more OS 1302, and an OS 1302 can control the execution of other programs such as, for example, to start or stop a program, or to manage resources of the computer 1300 used by a program. For example, controller 1310 includes OS 1302, which can include, or manage execution of, one or more programs, such as OS 1302 including (or, managing) drive monitor program 1304. In some embodiments, an OS 1302 can function as a hypervisor.

A program can be embodied as firmware (e.g., BIOS in a desktop computer, or a hypervisor) and the firmware can execute on one or more processors and, optionally, can use memory, included in the computer 1300. Firmware can be stored in a memory (e.g., a flash memory) of the computer 1300. For example, controller 1310 includes firmware 1340 stored in memory 1330. In other embodiments, firmware can be embodied as instructions (e.g., comprising a computer program product) on a storage medium (e.g., a CD-ROM, DVD-ROM, flash memory, or disk drive), and the computer 1300 can access the instructions from the storage medium.

In embodiments of the present disclosure, computer 1300 can include instructions non-intrusive drive performance monitoring. Controller 1310 includes, for example, drive assessor module 1307 and drive comparison module 1306, which can operate to compare the performance of various drives based on various drive performance data and/or I/O statistics. The computer 1300 can monitor drives at 1304 and/or the models at module 1308 in a memory 1330 of the computer 1300, such as controller 1310 storing the drive performance data at drive assessor module 1307 and perform cache clean-up and/or cache transmission control in memory 1330.

The example computer system 1300 and controller 1310 are not intended to limiting to embodiments. In embodiments, computer system 1300 can include a plurality of processors, interfaces, and inputs and can include other elements or components, such as networks, network routers or gateways, storage systems, server computers, virtual computers or virtual computing and/or I/O devices, cloud-computing environments, and so forth. It would be evident to one of skill in the art to include a variety of computing devices interconnected in a variety of manners in a computer system embodying aspects and features of the disclosure.

In embodiments, controller 1310 can be, for example, a computing device having a processor (e.g., 1312) capable of executing computing instructions and, optionally, a memory 1330 in communication with the processor. For example, controller 1310 can be a desktop or laptop computer; a tablet computer, mobile computing device, personal digital assistant (PDA), or cellular phone; or, a server computer, a high-performance computer (HPC), or a super computer. Controller 1310 can be, for example, a computing device incorporated into a wearable apparatus (e.g., an article of clothing, a wristwatch, or eyeglasses), an appliance (e.g., a refrigerator, or a lighting control), a mechanical device, or (for example) a motorized vehicle. It would be apparent to one skilled in the art that a computer embodying aspects and features of the disclosure can be any of a variety of computing devices having processors and, optionally, memory devices, and/or programs.

It is understood that numerous variations of drive performance monitoring could be made while maintaining the overall inventive design of various components thereof and remaining within the scope of the disclosure. Numerous alternate design or element features have been mentioned above.

As used herein, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Unless otherwise indicated, all numbers expressing feature sizes, amounts, and physical properties are to be understood as being modified by the term "about." Accordingly, unless indicated to the contrary, the numerical parameters set forth are approximations that can vary depending upon the desired properties sought to be obtained by those skilled in the art utilizing the teachings disclosed herein.

Although certain features are described generally herein relative to particular embodiments of the invention, it is understood that the features are interchangeable between embodiments to arrive at drive performance monitoring using non-intrusive methods that include features of different illustrated embodiments. It is further understood that certain embodiments discussed above include using the non-intrusive drive monitoring methods to more efficiently monitor and correct drive problems.

Reference is made herein to the accompanying drawings that form a part hereof and in which are shown by way of illustration at least one specific embodiment. The detailed description provides additional specific embodiments. It is to be understood that other embodiments are contemplated and may be made without departing from the scope or spirit of the present disclosure. The detailed description, therefore, is not to be taken in a limiting sense. While the present disclosure is not so limited, an appreciation of various aspects of the invention will be gained through a discussion of the examples provided.

What is claimed is:

1. A method, comprising:
   monitoring a plurality of storage devices using a storage management system, wherein the monitoring includes receiving and analyzing input/output data related to the storage devices;
   generating a model in response to the monitoring, wherein the model includes the detected input/output data related to at least a first and a second storage device, and wherein the input/output data includes at least one measurable storage device aspect;
   determining, in response to the generating, that the first storage device is a control storage device, and that the second storage device is to be compared to the control storage device, wherein the control storage device represents a storage device baseline to which other storage devices can be compared;
   comparing the input/output data of the second storage device to the control storage device according to the at least one measurable storage device aspect;
   determining that the second storage device is operating sub-optimally; and
   transmitting a notification that the second storage device is operating sub-optimally.

2. The method of claim 1, wherein the monitoring is performed host side using an operating system.

3. The method of claim 1, wherein the at least one measurable storage device aspect includes a workload type.

4. The method of claim 3, wherein the workload type is selected from the group consisting of: random, sequential, and mixed.

5. The method of claim 1, wherein the comparing includes comparing a response time of the control storage device to a response time of the second storage device using a functional fit.

6. The method of claim 5, wherein the functional fit utilizes a time average selected from the group consisting of: a sliding average and a weighted average.

7. The method of claim 1, wherein the notification that the second storage device is operating sub-optimally includes an indication of the type and severity of sub-optimal operation.

8. The method of claim 7, wherein the type and severity of sub-optimal operation indicates that the second storage device has a bad head, and wherein, in response to the indication, the bad head is depopulated using field remanufacturing.

9. The method of claim 1, wherein the comparing the input/output data of the second storage device to the control storage device according to the at least one measurable storage device aspect uses an exponentially weighted moving average of the input/output data.

10. The method of claim 1, wherein the detected input/output data also relates to a third storage device, and wherein the determining includes determining that the third storage device is to be compared to the control storage device, the method further comprising:
   comparing the input/output data of a third storage device to the control storage device according to the at least one measurable storage device aspect;
   determining that the third storage device is operating sub-optimally; and
   transmitting a notification that the third storage device is operating sub-optimally.

11. The method of claim 1, wherein the second storage device is power cycled and the second storage device is reset to factory defaults in response to the determining that the second storage device is operating sub-optimally.

12. A system for monitoring storage device performance, comprising:
   a processor;
   a memory operatively coupled to the processor;
   a storage medium operatively coupled to the processor and the memory, wherein the storage medium includes a data collection system configured to monitor a plurality of storage devices using a storage management system wherein the monitoring includes receiving and analyzing input/output data related to the storage devices; and
   a model generator configured to generate a model in response to the monitoring, wherein the model includes the detected input/output data related to at least a first and a second storage device, and wherein the input/output data includes at least one measurable storage device aspect;
   wherein the processor is configured to:
      determine, in response to the generating, that the first storage device is a control storage device, and that the second storage device is to be compared to the control storage device, wherein the control storage device represents a storage device baseline to which other storage devices can be compared;
      compare the input/output data of the second storage device to the control storage device according to the at least one measurable storage device aspect,
      determine that the second storage device is operating sub-optimally, and
      transmit a notification that the second storage device is operating sub-optimally.

13. The system of claim 12, wherein the at least one measurable storage device aspect includes a workload type.

14. The system of claim 12, wherein the comparing includes comparing a response time of the control storage device to a response time of the second storage device using a functional fit.

15. The system of claim 12, wherein the notification that the second storage device is operating sub-optimally includes an indication of the type and severity of sub-optimal operation, wherein the type and severity of sub-optimal operation indicates that the second storage device has a bad head, and wherein, in response to the indication, the bad head is depopulated using field remanufacturing.

16. The system of claim 12, wherein the comparing the input/output data of the second storage device to the control storage device according to the at least one measurable storage device aspect uses an exponentially weighted moving average of the input/output data.

17. The system of claim 12, wherein the detected input/output data also relates to a third storage device, and wherein the determining includes determining that the third storage device is to be compared to the control storage device, the processor further configured to:
   compare the input/output data of a third storage device to the control storage device according to the at least one measurable storage device aspect;
   determine that the third storage device is operating sub-optimally; and
   transmit a notification that the third storage device is operating sub-optimally.

18. The system of claim 12, wherein the second storage device is power cycled and the second storage device is reset to factory defaults in response to the determining that the second storage device is operating sub-optimally.

19. A computer program product for monitoring storage device performance comprising: a non-transitory computer-readable storage device having a computer-readable program stored therein, wherein the computer-readable program, when executed on a computing device, causes the computing device to:
   monitor a plurality of storage devices using a storage management system, wherein the monitoring includes receiving and analyzing input/output data related to the storage devices;
   generate a model in response to the monitoring, wherein the model includes the detected input/output data related to at least a first and a second storage device, and wherein the input/output data includes at least one measurable storage device aspect;
   determine, in response to the generating, that the first storage device is a control storage device, and that the second storage device is to be compared to the control storage device, wherein the control storage device represents a storage device baseline to which other storage devices can be compared;
   compare the input/output data of the second storage device to the control storage device according to the at least one measurable storage device aspect;
   determine that the second storage device is operating sub-optimally; and
   transmit a notification that the second storage device is operating sub-optimally.

20. The computer program product of claim 19, wherein the detected input/output data also relates to a third storage device, and wherein the determining includes determining that the third storage device is to be compared to the control storage device, and wherein the computer readable program further causes the computing device to:
   compare the input/output data of a third storage device to the control storage device according to the at least one measurable storage device aspect;
   determine that the third storage device is operating sub-optimally; and
   transmit a notification that the third storage device is operating sub-optimally.

* * * * *